(12) United States Patent
Roohparvar et al.

(10) Patent No.: US 8,174,919 B2
(45) Date of Patent: May 8, 2012

(54) APPARATUS AND METHOD FOR INCREASING DATA LINE NOISE TOLERANCE

(75) Inventors: Frankie F. Roohparvar, Monte Sereno, CA (US); Chia-Shing Jason Yu, Sunnyvale, CA (US); Jung-Sheng Hoei, Newark, CA (US); Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/914,309

(22) Filed: Oct. 28, 2010

(65) Prior Publication Data
US 2011/0038219 A1 Feb. 17, 2011

Related U.S. Application Data

(63) Continuation of application No. 12/101,337, filed on Apr. 11, 2008, now Pat. No. 7,826,290.

(51) Int. Cl.
*G11C 7/00* (2006.01)

(52) U.S. Cl. .............. 365/203; 365/189.09; 365/189.11; 365/206

(58) Field of Classification Search .................. 365/203, 365/189.09, 189.11, 206
See application file for complete search history.

(56) References Cited

U.S. PATENT DOCUMENTS

| 4,888,503 | A | 12/1989 | Young |
| 5,155,703 | A | 10/1992 | Nogle |
| 6,806,737 | B2 * | 10/2004 | Sung et al. ...................... 326/98 |
| 7,117,296 | B2 * | 10/2006 | Hosono et al. ................. 711/103 |
| 7,236,415 | B2 | 6/2007 | Forbes et al. |
| 2007/0279990 | A1 | 12/2007 | Choy |

* cited by examiner

*Primary Examiner* — Son Dinh
(74) *Attorney, Agent, or Firm* — Laffert Jay & Polglaze, P.A.

(57) ABSTRACT

Circuits and methods for improving noise tolerance in memories are disclosed such as those that include biasing a data line above a normal threshold voltage, either by providing a higher data line charge voltage with a voltage source, or by providing a higher data line charge voltage with a current source.

20 Claims, 5 Drawing Sheets

US 8,174,919 B2

APPARATUS AND METHOD FOR INCREASING DATA LINE NOISE TOLERANCE

RELATED APPLICATION

This Application is a Continuation of U.S. application Ser. No. 12/101,337, titled "APPARATUS AND METHOD FOR INCREASING DATA LINE NOISE TOLERANCE," filed Apr. 11, 2008, now U.S. Pat. No. 7,826,290 which is commonly assigned and incorporated herein by reference.

FIELD

The present disclosure relates generally to memories and in particular the present disclosure relates to bit line noise tolerance in memories.

BACKGROUND

Current mode sense amplifiers in memory devices are sensitive to voltage changes on data lines, such as those lines commonly referred to as bit lines of the memory. Due to adjacent bit line noise coupling, noise on the bit lines can cause a sense amplifier to trip falsely, leading to corrupted data at the sense amplifier output. In other words, if there is noise on the bit line, the sense amplifier could trigger even though a valid signal is not present. This can happen due to the way that threshold voltages are typically set in a NAND memory. In typical NAND memories, when a current of 100 nanoAmperes (nA) flows through a selected cell in the NAND string, the voltage when the current reaches that 100 nA is set as the threshold voltage of the cells. Noise on a bit line due to neighboring bit lines can exceed the sense amplifier (SA) noise margin and cause false signals at the sense amplifier output.

A typical NAND circuit is shown in FIG. 1. The core of the circuit comprises transistors MNSRC 102 and MNBL 104, which are biased by transistors MPB1 106 and MPB2 107. A RESET pulse is used in a reset phase to pre-charge the bit line 110 and to reset the sense amplifier output 112 to low, as is known. Node N2 is charged to Vcc, and sense amplifier output 112 is set to low.

In a read/sense phase, after the selected NAND string 114 is turned on, the bit line 110 starts to discharge, and transistor MNSRC 102 turns off. The voltage at node N1 rises, and transistor MNBL 104 turns on, discharging node N2 from Vcc and flipping sense amplifier output 112 from low to high as transistor MPIV 116 turns on.

For the reasons stated above, and for other reasons stated below which will become apparent to those skilled in the art upon reading and understanding the present specification, there is a need in the art for improvements in noise tolerance in NAND memories.

DETAILED DESCRIPTION

Figure 1:
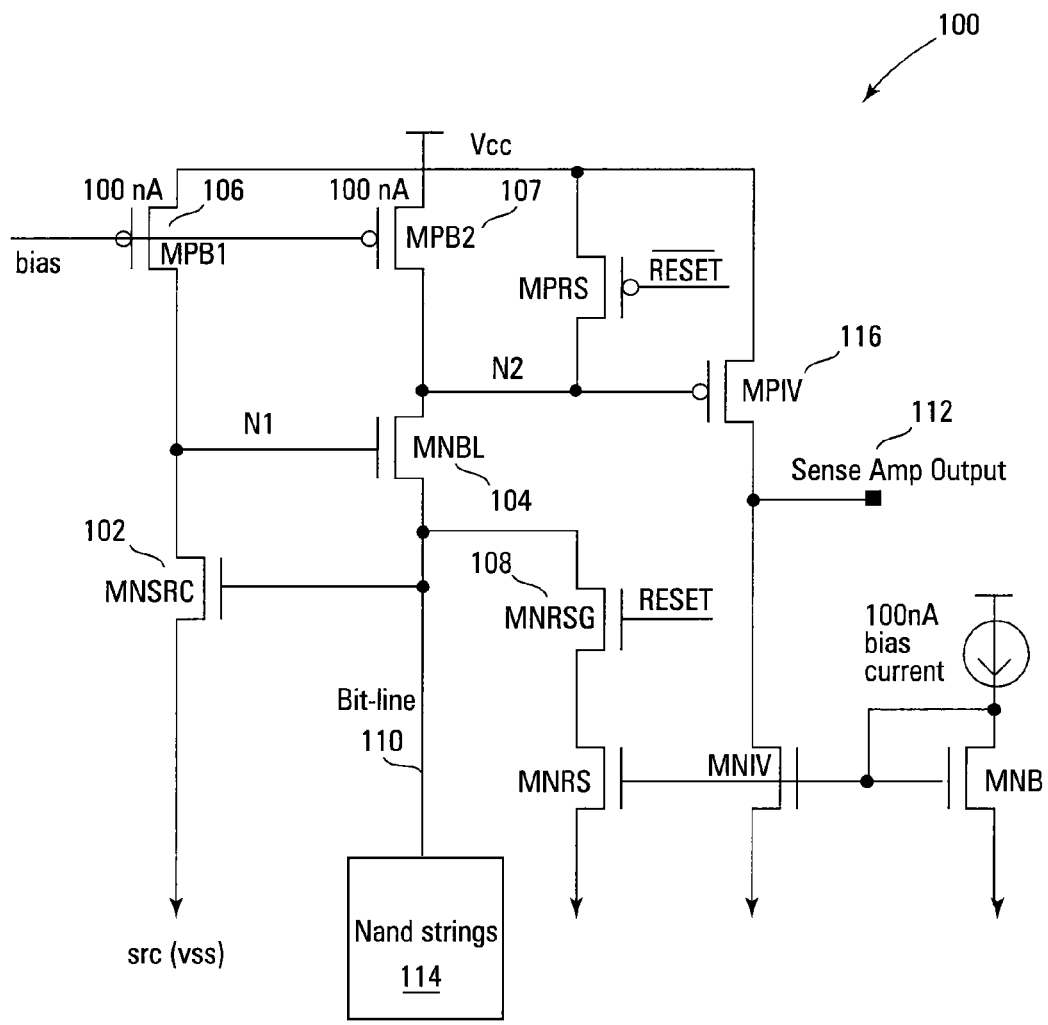
FIG. 1 is a circuit diagram of a portion of a typical NAND memory.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Figure 2:
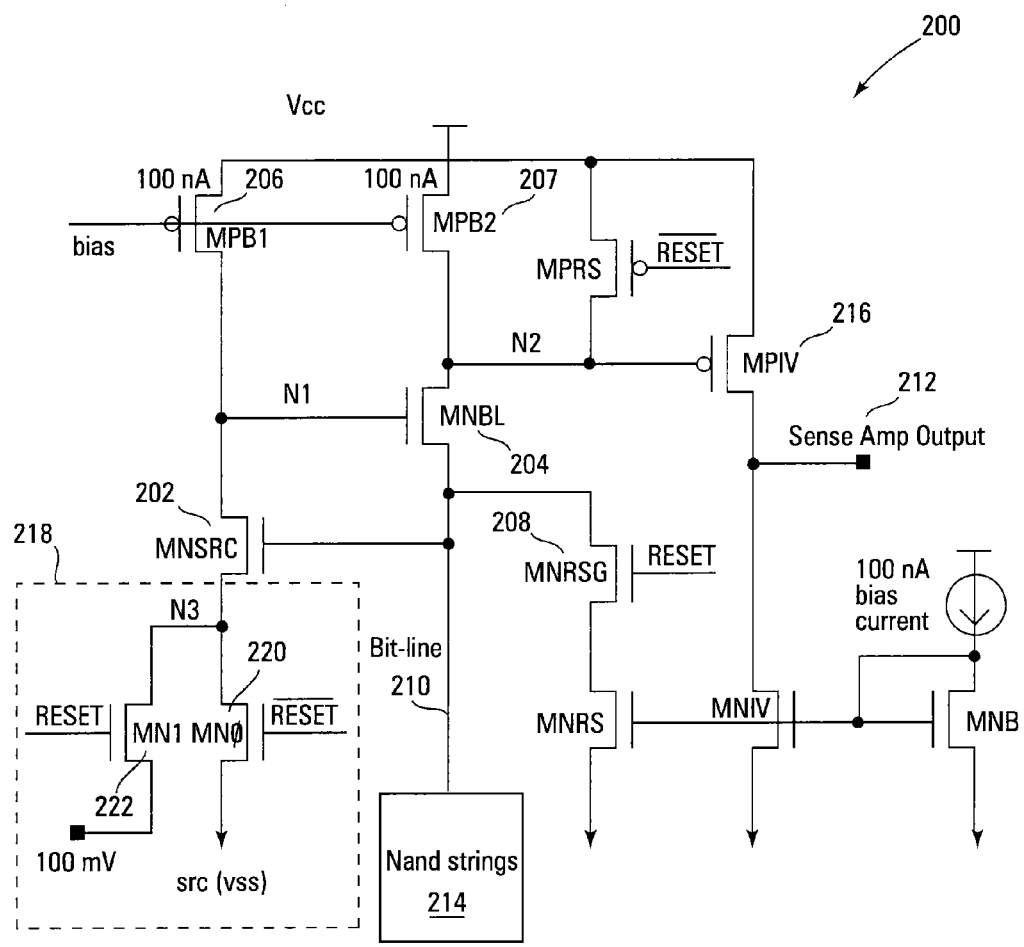
FIG. 2 is a circuit diagram of a noise tolerance circuit according to one embodiment of the present invention.

One embodiment of a circuit 200 for improving noise tolerance in NAND memories is shown in greater detail in FIG. 2. Circuit 200 is similar to that shown in FIG. 1, except that it has noise tolerance circuit 218 used in pre-charging the circuit 200, which introduces additional noise tolerance into the circuit. In FIG. 1, the source of transistor MNSRC 102 is connected directly to a reference or ground voltage Vss. In this embodiment shown in FIG. 2, in a reset phase, a pulse is used to pre-charge bit line 210 to a value based on the bias currents from bias transistors 206 and 207. In one embodiment, the loop is biased at a current of 100 nA. Noise tolerance circuit 218 comprises a pair of transistors 220 and 222, transistor 220 connected between node N3 at the source of transistor 202 and a reference or ground voltage Vss. Transistor 222 is connected between node N3 and a bias voltage of 100 milliVolts (mV). The gates of transistors 222 and 220 are connected to the reset signal and a complement of the reset signal, respectively. During the reset phase, the reset pulse pre-charges the bit line 210 to the determined threshold voltage (discussed above) plus the bias voltage of 100 mV through transistor 222 which charges node N3.

During reset or precharge phase, the bias voltage of 100 mV provided at the source of transistor 202 increases the source voltage of transistor 202, and therefore the bit line 210 is pre-charged to 100 mV higher than it would be simply with the bias caused by the 100 nA current through transistor 206.

During a sense phase, the reset signal is changed from high to low, transistor 222 turns off, and transistor 220 turns on, connecting node N3 to Vss. The bit line 210 begins discharging, but with the additional voltage of 100 mV on the pre-charged bit line 210, the sense amplifier does not trigger when any noise on the bit line 210 is below 100 mV due to the extra pre-charge bias. Once the noise tolerance of 100 mV is overcome, the sense amplifier can trigger. A noise tolerance of 100 mV is shown as illustrative, as this noise tolerance is sufficient to overcome most noise in present circuits. However, it should be understood that in different circuits, the amount of noise tolerance can be varies without departing from the scope of the embodiments.

During sensing, after the NAND string 214 is turned on, bit line 210 begins to discharge, and transistor 202 turns off. The voltage at node N1 rises, and turns on transistor 204. When transistor 204 turns on, node N2 discharges from Vcc and flips the sense amplifier output 212 from low to high. Node N3 is connected to the reference voltage such as ground during read/sense mode since the complement of the reset signal is high.

The circuit 200 introduces noise tolerance into the NAND sensing, but to do so uses a 100 mV voltage source. This voltage source can be implemented on chip in various ways. One example is to first generate a 100 mV reference voltage and buffer it with an analog buffer. The analog buffer sinks current in milli-ampere range as there are many sense amplifiers that can use this noise tolerance circuit.

Figure 3:
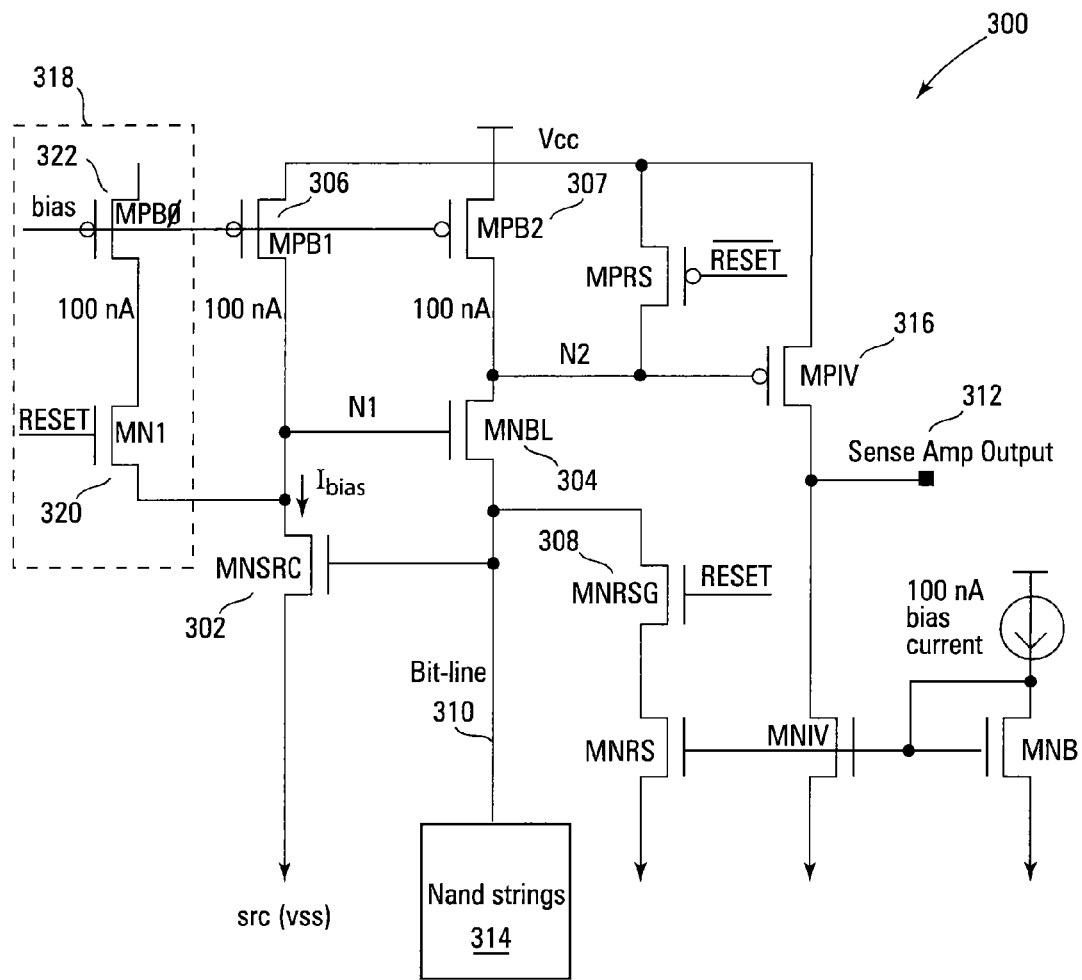
FIG. 3 is a circuit diagram of a noise tolerance circuit according to another embodiment of the present invention.

Another embodiment of a noise tolerance circuit 300 is shown in greater detail in FIG. 3. Circuit 300 is similar to that shown in FIG. 1, except that it has noise tolerance circuit 318 used in pre-charging the circuit 300, which introduces additional noise tolerance into the circuit. In FIG. 1, the source of transistor MNSRC 102 is connected directly to a reference or ground voltage Vss. In this embodiment shown in FIG. 3, in a reset phase, a pulse is used to pre-charge bit line 310 to a value based on the bias currents from bias transistors 306, 307, and 322 (part of noise tolerance circuit 318). In one embodiment, transistor 302 is biased at a current of 200 nA during reset.

Noise tolerance circuit 318 comprises a transistor 320, connected to node N1 at the gate of transistor 304 and drain of transistor 302, and a bias transistor 322 connected between supply voltage Vcc and the drain of transistor 320. Transistor 320 is gate connected to a reset signal, and transistor 322 is gate connected to a bias voltage. During a reset phase, a reset pulse is used to pre-charge bit line 310 to one gate to source voltage (Vgs) above Vss and to reset the sense amplifier output 312 to low. During reset, a noise tolerance voltage is introduced into system 300 with an additional bias transistor 322, biased at 100 nA in one embodiment. Transistor 320 is on during reset due to its gate connection to the reset signal, so an extra 100 nA of current runs through transistor 302 than it does in the circuit of FIG. 1. The source terminal of transistor 302 is tied to reference or ground voltage Vss. The bias current $I_{bias}$ through the transistor 302 during the reset phase is 200 nA. The bias current is switched to 100 nA after reset. This lowers the voltage at node N1 to a level close to ground from the level of two gate to source voltages (Vgs) and makes sure that transistor 304 is more fully turned off before sensing begins.

During sensing, the loop of noise tolerance circuit 318 is cut off because the reset signal is low, and the selected access line, such as that commonly referred to as a word line) is ramped. The selected NAND cell in NAND string 314 is initially off, but begins to turn on as the voltage at the selected word line approaches its cell Vt and bit line 310 begins to discharge, turning transistor 302 off. The voltage at node N1 rises and turns on transistor 304, and node N2 discharges from supply voltage Vcc and flips sense amplifier output 312 from a low state to a high state. At cell current of 100 nA (in this embodiment the designated cell current to establish the cell threshold voltage), once the selected word line voltage is high enough that the selected cell current reaches 100 nA, node N2 starts to pull low as the bit line discharges, and the sense amplifier output 312 is activated because the cell has reached its target threshold voltage. It should be understood that while the transistors described herein have been described using the terms drain and source, the operative connection of such transistors determines the source and drain. For example, in N-type MOS devices, the source is where the current leaves the transistor, and in P-type devices, the source is where current enters the transistor.

Figure 4:
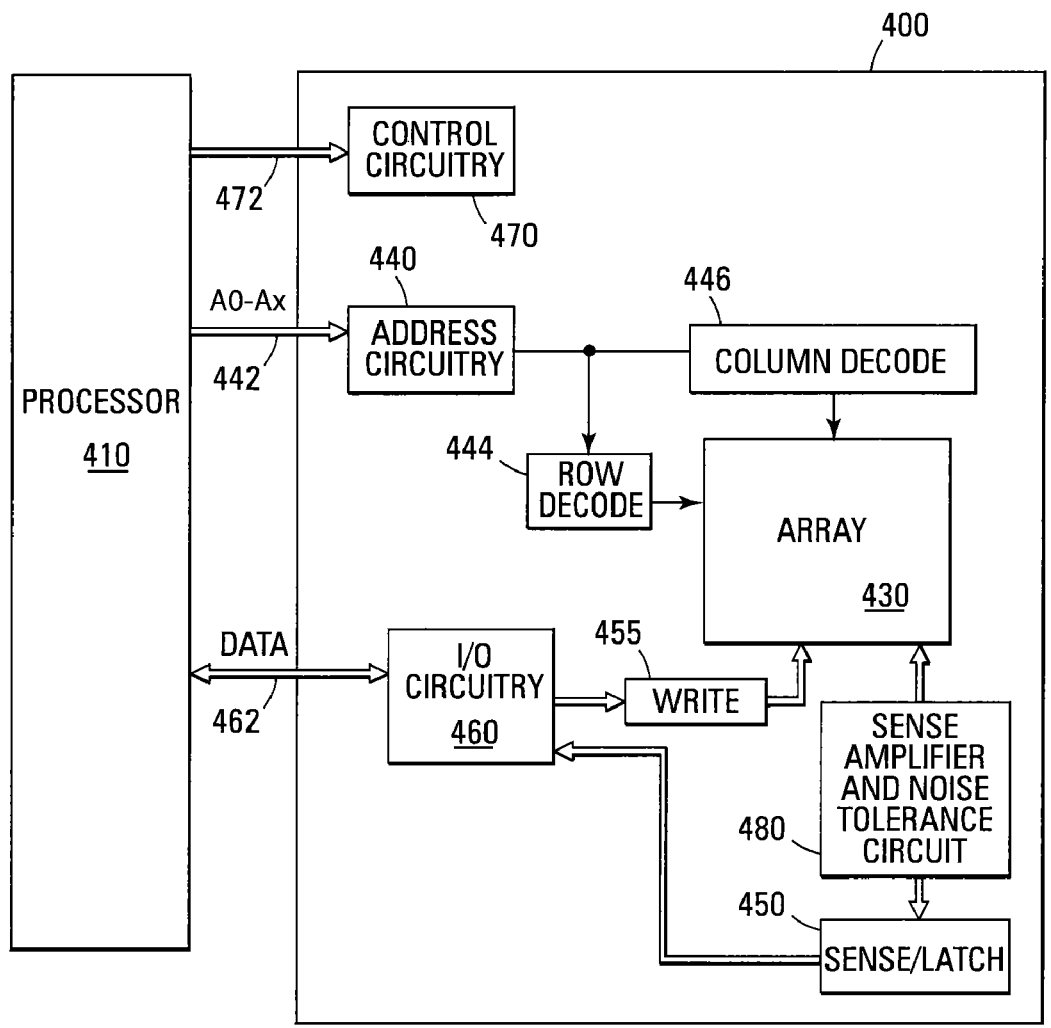
FIG. 4 is a functional block diagram of an electrical system having at least one memory device with a memory array configuration according to one embodiment of the present invention.

FIG. 4 is a functional block diagram of a memory device 400, such as a flash memory device, of one embodiment of the present invention, which is coupled to a processor 410. The memory device 400 and the processor 410 may form part of an electronic system 420. The memory device 400 has been simplified to focus on features of the memory that are helpful in understanding the present invention. The memory device includes an array of memory cells 430 having a sense amplifier and noise tolerance circuit 480 such as those shown in FIGS. 2 and 3 and described above. The memory array 430 is arranged in banks of rows and columns.

An address buffer circuit 440 is provided to latch address signals provided on address input connections A0-Ax 442. Address signals are received and decoded by row decoder 444 and a column decoder 446 to access the memory array 430. It will be appreciated by those skilled in the art, with the benefit of the present description, that the number of address input connections depends upon the density and architecture of the memory array. That is, the number of addresses increases with both increased memory cell counts and increased bank and block counts.

The memory device reads/senses data in the array 430 by sensing voltage or current changes in the memory array columns using sense amplifier and noise tolerance circuit 480 connected between array 420 and sense/latch circuitry 450. The sense/latch circuitry, in one embodiment, is coupled to sense and latch a row of data from the memory array, with noise tolerance circuit 480 operating as described above. Data input and output buffer circuitry 460 is included for bi-directional data communication over a plurality of data (DQ) connections 462 with the processor 410, and is connected to write circuitry 455 and sense/latch circuitry 450 for performing sense and write operations on the memory 400.

Command control circuit 470 decodes signals provided by control connections 472 from the processor 410. These signals are used to control the operations on the memory array 430, including data read/sense, data write, and erase operations. The flash memory device has been simplified to facilitate a basic understanding of the features of the memory. A more detailed understanding of internal circuitry and functions of flash memories are known to those skilled in the art.

Figure 5:
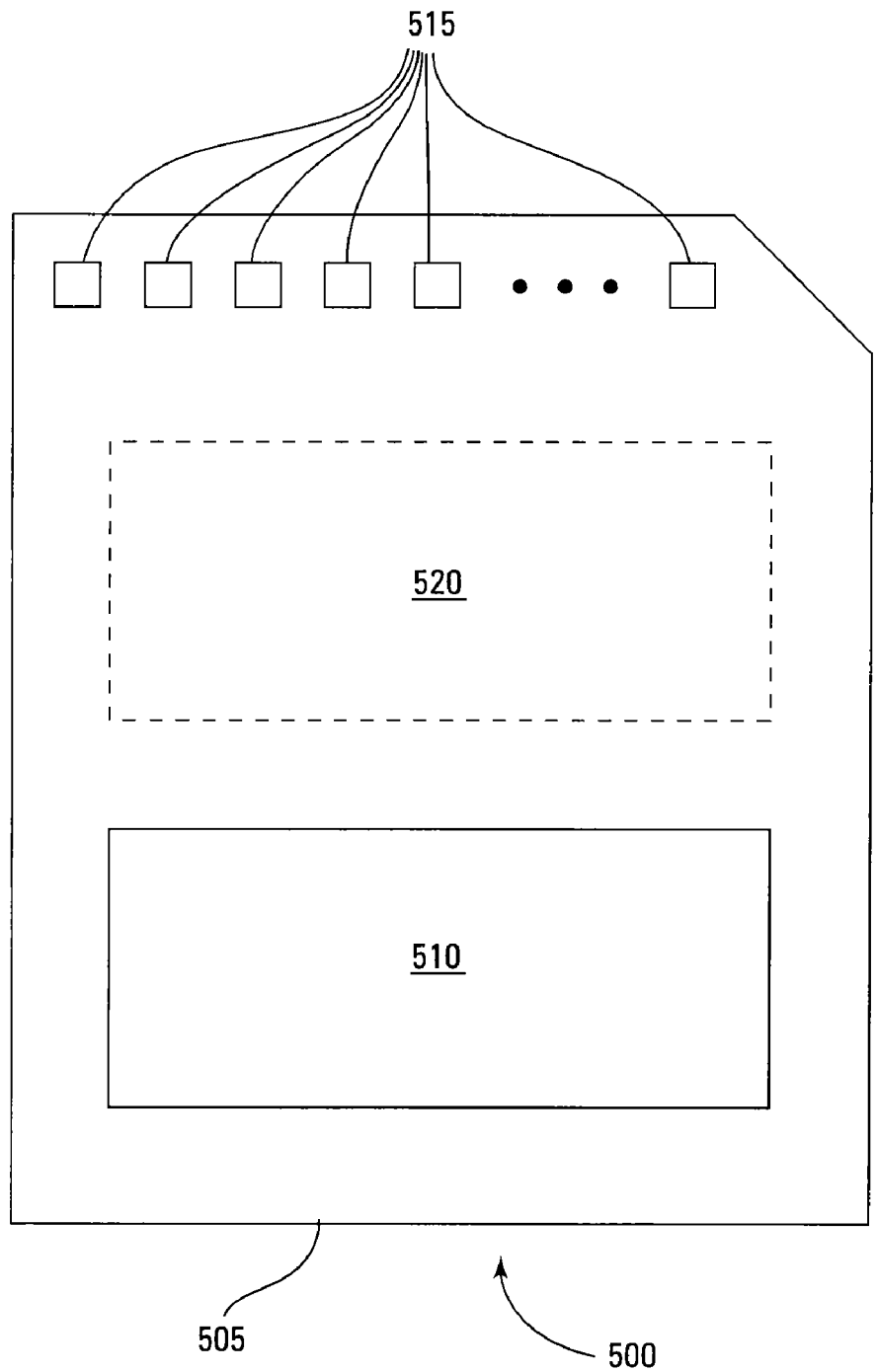
FIG. 5 is a functional block diagram of a memory module having at least one memory device in accordance with an embodiment of the invention.

FIG. 5 is an illustration of an exemplary memory module 500. Memory module 500 is illustrated as a memory card, although these concepts discussed with reference to memory module 500 are applicable to other types of removable or portable memory, e.g., USB flash drives, and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 is a non-volatile memory including noise tolerance according to various embodiments of the present invention. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface. In general, however, contacts 515 provide an interface for passing control, address and/or data signals between the memory module 500 and a host having compatible receptors for the contacts 515.

The memory module 500 may optionally include additional circuitry 520 which may be one or more integrated circuits and/or discrete components. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC (application specific integrated circuit). Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

Noise tolerance circuits and methods have been described that bias a bit line to an amount above a threshold voltage using either a bias voltage or a bias current to pre-charge the bit line to an amount sufficient to overcome most noise events in the circuit, thereby preventing false tripping of sense amplifiers in the circuit.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for improving noise tolerance in a memory, comprising:
   precharging a data line with a noise tolerance circuit and a precharge circuit; and
   allowing sensing on the data line when noise tolerance precharged into the data line is overcome, wherein precharging further comprises:
   charging the data line with a directly applied bias voltage to a determined voltage above its threshold voltage.

2. The method of claim 1, wherein charging comprises charging to approximately 100 milliVolts above the threshold voltage.

3. A method for improving noise tolerance in a memory, comprising:
   precharging a data line with a noise tolerance circuit and a precharge circuit; and
   allowing sensing on the data line when noise tolerance precharged into the data line is overcome, wherein precharging further comprises:
   charging the data line with a bias current through a transistor, to a determined voltage above a reference voltage.

4. The method of claim 3, wherein charging comprises charging the data line with a bias current of a determined level greater than an operating bias current.

5. The method of claim 4, wherein the bias current is approximately twice a normal bias current.

6. The method of claim 4, wherein the bias current is approximately 100 nanoAmperes above the operating bias current.

7. The method of claim 3, wherein charging the data line comprises charging the data line to a voltage level approximately one gate to source voltage of the transistor above the reference voltage.

8. A memory device, comprising:
   an array of memory cells;
   control circuitry to read, write and erase the memory cells;
   a precharge circuit; and
   a noise tolerance circuit to introduce a noise tolerance to a data line of the memory; wherein the noise tolerance circuit further comprises:
   a directly applied bias voltage to bias the data line to a determined voltage above its threshold voltage.

9. The memory device of claim 8, wherein the noise tolerance circuit further comprises:
   a first transistor having a drain/source coupled to a first node, a source/drain coupled to a bias current, and a gate coupleable to a reset signal;
   a second transistor having a drain/source coupled to the first node, a source/drain coupled to a reference voltage, and a gate coupled to a data line of the memory for pre-charging the data line with a threshold voltage.

10. The memory device of claim 9, and further comprising:
    a third transistor coupled between a supply voltage and the source/drain of the first transistor, the third transistor gate coupleable to a bias voltage to create the bias current.

11. The memory device of claim 10, and further comprising:
    a fourth transistor connected between the supply voltage and the first node, the fourth transistor gate coupleable to the bias voltage to add to the bias current.

12. The memory device of claim 9, and further comprising:
    a first bias transistor coupled between a supply voltage and the source/drain of the first transistor, and a second bias transistor coupled between the supply voltage and the first node, the first and the second bias transistors gate coupleable to a bias voltage to induce the bias current into the second transistor.

13. The memory device of claim 9, and further comprising:
    a feedback loop to create the bias current, the feedback loop comprising a first bias transistor and a second bias transistor, the first bias transistor coupled between a supply voltage and the source/drain of the first transistor, the second bias transistor coupled between the supply voltage and the first node, and each bias transistor gate coupled to the bias voltage.

14. The memory device of claim 9, and further comprising:
    a bias transistor coupled between a supply voltage and the drain/source of the first transistor, and gate coupled to a bias voltage.

15. A memory device, comprising:
an array of memory cells;
control circuitry to read, write and erase the memory cells;
a precharge circuit; and
a noise tolerance circuit to introduce a noise tolerance to a data line of the memory; wherein the noise tolerance circuit further comprises:
a bias current applied through a transistor to bias the data line a determined voltage above its threshold voltage.

16. The memory device of claim 15, and further comprising:
a feedback loop to create the bias current, the feedback loop comprising a first bias transistor and a second bias transistor, the first bias transistor coupled between a supply voltage and the source/drain of the first transistor, the second bias transistor coupled between the supply voltage and the first node, and each bias transistor gate coupled to the bias voltage.

17. A memory device, comprising:
an array of memory cells;
control circuitry to read, write and erase the memory cells;
a precharge circuit; and
a noise tolerance circuit to introduce a noise tolerance to a data line of the memory, wherein the noise tolerance circuit is configured to precharge a data line with a noise tolerance circuit and a precharge circuit; and to allow sensing on the data line when noise tolerance precharged into the data line is overcome, wherein the noise tolerance circuit is further configured to charge the data line with a directly applied bias voltage to a determined voltage above its threshold voltage.

18. A memory device, comprising:
an array of memory cells;
control circuitry to read, write and erase the memory cells;
a precharge circuit; and
a noise tolerance circuit to introduce a noise tolerance to a data line of the memory, wherein the noise tolerance circuit is configured to precharge a data line with a noise tolerance circuit and a precharge circuit; and to allow sensing on the data line when noise tolerance precharged into the data line is overcome, wherein the noise tolerance circuit is further configured to charge the data line with a bias current through a transistor, to a determined voltage above a reference voltage.

19. The memory device of claim 18, wherein the noise tolerance circuit is further configured to charge the data line with a bias current of a determined level greater than an operating bias current.

20. The memory device of claim 18, wherein the noise tolerance circuit is further configured to charge the data line to a voltage level approximately one gate to source voltage of the transistor above the reference voltage.

* * * * *

UNITED STATES PATENT AND TRADEMARK OFFICE
CERTIFICATE OF CORRECTION

| | | |
|---|---|---|
| PATENT NO. | : 8,174,919 B2 | Page 1 of 1 |
| APPLICATION NO. | : 12/914309 | |
| DATED | : May 8, 2012 | |
| INVENTOR(S) | : Frankie F. Roohparvar et al. | |

It is certified that error appears in the above-identified patent and that said Letters Patent is hereby corrected as shown below:

On the Title page, in field (74), in "Attorney, Agent or Firm", in column 2, line 1, delete "Laffert" and insert -- Leffert --, therefor.

In column 7, line 9, in Claim 15, delete "a" and insert -- to a --, therefor.

Signed and Sealed this
Tenth Day of July, 2012

David J. Kappos
*Director of the United States Patent and Trademark Office*